(12) United States Patent
Tsukaguchi et al.

(10) Patent No.: US 6,918,529 B2
(45) Date of Patent: Jul. 19, 2005

(54) METHOD FOR PRODUCING METAL/CERAMIC BONDING CIRCUIT BOARD

(75) Inventors: Nobuyoshi Tsukaguchi, Nagano (JP); Masami Kimura, Chiba (JP)

(73) Assignee: Dowa Mining Co., Ltd., Tokyo (JP)

(*) Notice: Subject to any disclaimer, the term of this patent is extended or adjusted under 35 U.S.C. 154(b) by 7 days.

(21) Appl. No.: 10/254,750

(22) Filed: Sep. 25, 2002

(65) Prior Publication Data

US 2003/0066865 A1 Apr. 10, 2003

(30) Foreign Application Priority Data

Sep. 28, 2001 (JP) ..................................... P2001-304434

(51) Int. Cl.$^7$ ............................ B23K 31/02; C23F 1/00
(52) U.S. Cl. ....................... 228/122.1; 228/159; 216/41
(58) Field of Search .......................... 228/122.1, 123.1, 228/124.1, 125, 124.5, 155, 159, 214, 215; 216/20, 41, 100

(56) References Cited

U.S. PATENT DOCUMENTS

| | | | | |
|---|---|---|---|---|
| 3,883,947 A | * | 5/1975 | Kruger et al. | 216/6 |
| 4,358,748 A | * | 11/1982 | Gruner et al. | 338/25 |
| 5,200,026 A | * | 4/1993 | Okabe | 216/48 |
| 5,302,492 A | * | 4/1994 | Ott et al. | 430/314 |
| 5,354,415 A | * | 10/1994 | Fushii et al. | 216/13 |
| 5,377,406 A | * | 1/1995 | Matsumoto et al. | 216/20 |
| 5,800,726 A | * | 9/1998 | Cotte et al. | 216/108 |
| 6,015,505 A | * | 1/2000 | David et al. | 252/79.2 |
| 6,183,883 B1 | * | 2/2001 | Mori et al. | 428/621 |
| 6,197,435 B1 | * | 3/2001 | Tsujimura et al. | 428/621 |
| 6,223,429 B1 | * | 5/2001 | Kaneda et al. | 29/832 |
| 6,475,401 B1 | * | 11/2002 | Schulz-Harder | 216/20 |
| 6,706,622 B1 | * | 3/2004 | McCormick | 438/614 |

FOREIGN PATENT DOCUMENTS

| | | |
|---|---|---|
| EP | 0 789 397 | 8/1997 |
| EP | 0 798 779 | 10/1997 |
| EP | 0 827 198 | 3/1998 |
| JP | 04176882 | 6/1990 |
| JP | 2594475 | 10/1991 |
| JP | 7-36467 | 1/1993 |
| JP | 05013920 | 1/1993 |
| JP | 05267496 | 10/1993 |
| JP | 10154866 | 6/1998 |
| JP | 11135915 | 5/1999 |
| JP | 11154788 | * 6/1999 |
| JP | 11-154788 | * 6/1999 |
| JP | 2000124585 | 4/2000 |
| JP | 2001135929 | 5/2001 |

* cited by examiner

*Primary Examiner*—Kiley S. Stoner
(74) *Attorney, Agent, or Firm*—Bachman & LaPointe, P.C.

(57) ABSTRACT

After copper plates 14 are bonded to both sides of a ceramic substrate 10 via a brazing filler metal 12, UV curing alkali peeling type resists 16 are applied on predetermined portions of the surfaces of the copper plates 14 to etch undesired portions of the copper plates 14 to form a metal circuit portion. While the resists 16 are maintained, undesired portions of the brazing filler metal 12 and a reaction product, which is produced by a reaction of the brazing filler metal 12 with the ceramic substrate 10, are removed (or undesired portions of the brazing filler metal 12 and a reaction product, which is produced by a reaction of the brazing filler metal 12 with the ceramic substrate 10, are removed, and the side portion of the metal circuit portion is etched). Thereafter, the resists 16 are peeled off, and an Ni—P electroless plating 18 is carried out. Thus, in a method for producing a metal/ceramic bonding circuit board, it is possible to easily control the sectional shape of a metal/ceramic bonding circuit board by a smaller number of steps and at low costs, and it is possible to produce a metal/ceramic bonding circuit board which is more reliable with respect to thermal shock resistance and insulation performance.

36 Claims, 4 Drawing Sheets

METHOD FOR PRODUCING METAL/CERAMIC BONDING CIRCUIT BOARD

BACKGROUND OF THE INVENTION

1. Field of the Invention

The present invention generally relates to a method for producing a metal/ceramic bonding circuit board. More specifically, the invention relates to a method for producing a metal/ceramic bonding circuit board wherein a metal plate is bonded to a ceramic substrate via a brazing filler metal to form a circuit and on which a large power element, such as a power module, is suitably mounted.

2. Description of the Prior Art

In a typical method for producing a ceramic circuit board for a power module or for mounting a semiconductor thereon, a metal plate and a ceramic substrate are first bonded to each other. For example, there is industrially utilized the direct bonding method for arranging a copper plate on a ceramic substrate so as to allow the copper plate to directly contact the ceramic substrate and for heating the copper plate and the ceramic substrate in an inert gas to bond the ceramic substrate and the copper plate to each other. There is also industrially utilized the brazing and soldering method for arranging a copper plate on a ceramic substrate via a brazing filler metal containing an active metal, such as Ti, Zr or Hf, and for heating them in vacuo to bond the ceramic substrate and the copper plate to each other. In the brazing and soldering method, the active metal concerns the bonding of the ceramic substrate to the metal plate, and the ceramic substrate reacts with the brazing filler metal to form a reaction product. It is generally considered that a brazing filler metal reacts with a ceramic substrate of an oxide, such as $Al_2O_3$, to form an oxide of an active metal, reacts with a ceramic substrate of a non-oxide, such as AlN or $Si_3N_4$, to form a nitride of an active metal, and reacts with a ceramic substrate of a carbide, such as SiC, to form a carbide of an active metal, so that the product bonds the ceramic substrate to the copper plate. That is, the brazing filler metal layer after bonding comprises a layer mainly containing the metal of the brazing filler metal, and a layer mainly containing an interface product of the interface between the brazing filler metal and the ceramic substrate.

As a method for forming a predetermined circuit shape by patterning after bonding a metal plate, such as a copper plate, for a circuit or radiation, there is an etching method which is also utilized for a printed circuit board or the like. This method is widely utilized since it is easy to obtain a fine pattern and it is possible to relatively simply cope with the change of a circuit design. In this method, for example, a mixed solution of iron chloride or copper chloride, hydrochloric acid and hydrogen peroxide is usually used as an etchant for a metal plate, such as a copper plate. In the case of the above described direct bonding method, this etchant can carry out etching and patterning without causing problems since it is possible to ignore reaction products. However, in the case of the brazing and soldering method, this etchant can dissolve the metal plate, but it can not dissolve the brazing filler metal and the reaction product of the brazing filler metal with the ceramic substrate (the general term for the brazing filler metal and the reaction product will be hereinafter referred to as a "brazing filler metal and so forth"), so that the brazing filler metal and so forth remain between circuit patterns and/or on the edge face of the substrate. Since the brazing filler metal and so forth are conductors, it is not possible to satisfy basic characteristics of a circuit board, which isolate the circuit patterns from each other and/or the surf ace and reverse of the board from each other. As a method for removing the brazing filler metal and so forth, there is known a method for using hydrofluoric acid alone or a mixed acid of hydrofluoric acid and at least one inorganic acid selected from the group consisting of nitric acid, sulfuric acid and hydrochloric acid, or for using a solution containing aqua regia, sodium hydroxide and/or potassium hydroxide, to treat and remove the brazing filler metal and so forth (see Japanese Patent No. 2,594,475). There is also known a method for treating the brazing filler metal and so forth with a solution containing a hydrogen halide and/or an ammonium halide, and then, treating them with a solution containing an inorganic acid and hydrogen peroxide, to remove the brazing filler metal and so forth (see Japanese Publication No. 7-36467).

The sectional shape of the end portion of a circuit pattern of a metal/ceramic bonding circuit board, wherein a metal plate is bonded to a ceramic substrate via a brazing filler metal, greatly concerns characteristics of the circuit board, so that it is desired that the optimum shape of the end portion is formed in accordance with required characteristics. That is, in order to enhance reliability against thermal shocks, the protrusion of the brazing filler metal from the edge portion of a copper plate is effective in suppression of the thermal stress caused by the difference in coefficient of thermal expansion between the metal plate and the ceramic substrate bonded thereto.

It is known that the protrusion of the brazing filler metal is greatly effective in thermal shock resistance. As a conventional method for producing such a protrusion, a so-called twice-resist and twice-etching method or a so-called once-resist (removing) method is adopted when the brazing filler metal is removed. The twice-resist and twice-etching method is a method for applying a resist on a predetermined portion of the surface of a metal plate, etching undesired portions of the metal plate to form metal circuits, removing the resist, removing undesired portions of a brazing filler metal remaining between the metal circuits, applying a resist on the surface of the metal circuits again, and etching undesired portions of the metal plate again, i.e., a method for carrying out resist processes twice and etching processes twice. On the other hand, the once-resist (removing) method is a method for applying a resist on a predetermined portion of the surface of a metal plate after bonding of the metal plate, etching undesired portions of the metal plate to form metal circuits, peeling off and removing the resist, and removing undesired portions of a brazing filler metal remaining between the metal circuits with, e.g., fluoride chemicals. In the former, it is possible to obtain the large protrusion of the brazing filler metal, but the number of processes is large and costs are high. In the latter, the number of processes is the same as that in usual methods, but it is difficult to increase the protrusion of the brazing filler metal from the nature of the chemicals. In addition, there are some cases where it is not possible to ignore attacks on the ceramic substrate from the nature of the chemicals. Moreover, the top of the metal plate is also dissolved in the chemicals, which removes the brazing filler metal, to cause shear drops. Therefore, a discrepancy is caused in the mounting of a chip, such as a semiconductor chip, so that there are some cases where it is required to carry out a design change, such as the increase of the size.

However, in conventional methods, it is difficult to control the length of the brazing filler metal and so forth protruding the edge portion of the metal plate (which will be hereinafter referred to as a "brazing filler metal protruding length". In particular, if the brazing filler metal protruding length is set to be long, the number of processes is larger than that in usual processes, so that production costs increase. In addition, a brazing filler metal removing agent causes shear drops from the top of the metal plate to cause dimensional discrepancy when a chip, such as a semiconductor chip, is mounted thereon.

In addition, if chemicals containing hydrogen halide or ammonium halide, typically hydrofluoric acid, a mixed acid thereof or ammonium fluoride, are used as the brazing filler metal removing agent, there are some cases where the ceramic substrate is also corroded simultaneously with the removal of the brazing filler metal and so forth, so that characteristics with respect to reliability as the ceramic circuit board are deteriorated. On the other hand, if the corrosion of the ceramic substrate is intended to be suppressed, there is some possibility that it is not possible to completely remove the brazing filler metal and so forth between circuit patterns, so that the brazing filler metal and so forth remain, thereby causing defectives. In addition, since the ratio of the etch rate of the brazing filler metal to that of the metal plate is small, it is difficult to greatly protrude the brazing filler metal (e.g., >30 $\mu$m). Moreover, since halogen compounds, such as hydrofluoric acid, are easily corroded, production facilities, waste solution treating facilities and waste solution treatments are comparatively high in cost, so that production costs for products have a tendency to increase.

On the other hand, if an alkaline mixed solution of a chelating agent (an alkaline chelate removing agent) is used as the brazing filler metal removing agent, damage to ceramic is relatively small, and the solubility of the brazing filler metal is good, but a generally used alkali peeling type etching resist, together with the brazing filler metal, is removed. For that reason, in order to produce amore reliable substrate by protruding the brazing filler metal from the metal circuit portion, an etching resist printing process and an etching process must be carried out again, so that production costs are higher than usual processes.

On the other hand, an organic solvent peeling type etching resist withstands alkali solutions. However, in order to remove the resist, an environmentally toxic organic solvent, such as trichloroethylene, must be used. However, environmental measures can be carried out by facilities.

SUMMARY OF THE INVENTION

It is therefore an object of the present invention to eliminate the aforementioned problems and to provide a method for producing a metal/ceramic bonding circuit board, the method being capable of easily controlling the sectional shape of a metal/ceramic bonding circuit board by a smaller number of steps and at low costs and capable of producing a metal/ceramic bonding circuit board being more reliable with respect to thermal shock resistance and insulation performance.

It is another object of the present invention to provide a method for producing a metal/ceramic bonding circuit board, the method being capable of preventing shear drops from being caused from the top of a metal plate, capable of using chemicals which have smaller attacks on a ceramic substrate and which consider environment, and capable of simplifying facilities, such as waste solution treating facilities, and waste solution treatments.

In order to accomplish the aforementioned and other objects, the inventors have diligently studied and found that a method for producing a metal/ceramic bonding circuit board, wherein a metal plate is bonded to at least one side of a ceramic substrate via a brazing filler metal to form a circuit pattern, can easily control the sectional shape of a metal/ceramic bonding circuit board by a smaller number of steps and at low costs and can produce a metal/ceramic bonding circuit board being more reliable with respect to thermal shock resistance and insulation performance, if the method comprises the steps of: bonding a metal plate of a metal to at least one side of a ceramic substrate via a brazing filler metal; applying a resist on a predetermined portion of a surface of the metal plate to etch and remove an undesired portion of the metal plate to form a metal circuit portion; and removing an undesired portion of the brazing filler metal and a reaction product, which is produced by a reaction of the brazing filler metal with the ceramic substrate (or removing an undesired portion of the brazing filler metal and a reaction product, which is produced by a reaction of the brazing filler metal with the ceramic substrate, and etching a side portion of the metal circuit portion), while maintaining the resist, and thereafter, peeling off the resist to form a circuit pattern.

According to one aspect of the present invention, there is provided a method for producing a metal/ceramic bonding circuit board comprising the steps of: bonding a metal plate of a metal to at least one side of a ceramic substrate via a brazing filler metal; applying a resist on a predetermined portion of a surface of the metal plate to etch and remove an undesired portion of the metal plate to form a metal circuit portion; and removing an undesired portion of the brazing filler metal and a reaction product, which is produced by a reaction of the brazing filler metal with the ceramic substrate, while maintaining the resist, and thereafter, peeling off the resist to form a circuit pattern.

According to another aspect of the present invention, there is provided a method for producing a metal/ceramic bonding circuit board comprising the steps of: bonding a metal plate of a metal to at least one side of a ceramic substrate via a brazing filler metal; applying a resist on a predetermined portion of a surface of the metal plate to etch and remove an undesired portion of the metal plate to form a metal circuit portion; and removing an undesired portion of the brazing filler metal and a reaction product, which is produced by a reaction of the brazing filler metal with the ceramic substrate, and etching a side portion of the metal circuit portion, while maintaining the resist, and thereafter, peeling off the resist to form a circuit pattern.

In these methods for producing a metal/ceramic bonding circuit board, a ratio of a mean dissolving rate of the metal to a mean dissolving rate of the brazing filler metal is preferably in the range of from 1 to 20 at the removing step.

According to a further aspect of the present invention, there is provided a method for producing a metal/ceramic bonding circuit board comprising the steps of: bonding a metal plate of a metal to at least one side of a ceramic substrate via a brazing filler metal; and removing an undesired portion of the brazing filler metal and a reaction product, which is produced by a reaction of the brazing filler metal with the ceramic substrate, to form a circuit pattern, wherein at the removing step, there are used such chemicals that a ratio of a mean dissolving rate of the metal to a mean dissolving rate of the brazing filler metal is in the range of from 1 to 20.

In these methods for producing a metal/ceramic bonding circuit board, the resist is preferably an alkali peeling type resist. At the removing step, a brazing filler metal removing agent having a pH of 3 to 6.5 is preferably used. Alternatively, at the removing step, a brazing filler metal removing agent which is prepared from a chelating agent and aqueous hydrogen peroxide, or a brazing filler metal removing agent which is prepared from a chelating agent, aqueous hydrogen peroxide and a pH regulator, is preferably used. In this case, the chelating agent is preferably formed of one or more compounds selected from the group consisting of ethylenediaminetetraacetic acid (EDTA), nitrilotriacetic acid (NTA), cyclohexanediamine-N,N',-tetraacetic acid (CyDTA), diethylenetriaminepentaacetic acid (DTPA), triethylenetetramine-N,N,N',N'',N''',N'''-hexaacetic acid (TTHA), glycoletherdiamine-N,N,N',N'-tetraacetic acid (GEDTA) and salts thereof.

The ceramic substrate is preferably formed of a material selected from the group consisting of nitrides, oxides and carbides. The brazing filler metal is preferably formed of a material selected from the group consisting of alloys containing silver and an active metal, compounds containing silver and an active metal, and mixtures thereof. The metal plate is preferably formed of a material selected from the group consisting of copper, aluminum, alloys containing copper, alloys containing aluminum, and mixtures thereof.

In addition, a silver chloride layer on the surface of the brazing filler metal is preferably treated with chemicals to be removed, before removing the undesired portion of the brazing filler metal and the reaction product of the brazing filler metal with the ceramic substrate after etching the undesired portion of the metal plate. In this case, the chemicals used for removing the silver chloride layer is preferably at least one of ammonium thiosulfate and an alkali thiosulfate. Furthermore, it is considered that the silver chloride layer is mainly produced when the metal plate is etched with the above described hydrochloric acid chemicals or when washing is carried out after etching.

Moreover, a brazing filler metal protruding length, which is a length of the brazing filler metal protruding from an edge portion of the metal circuit portion, is preferably 30 μm or more. The metal circuit portion and the brazing filler metal are preferably treated by at least one of nickel plating, nickel alloy plating and gold plating, after peeling of the resist. Alternatively, the metal circuit portion and the brazing filler metal may be treated by preservation.

According to a still further aspect of the present invention, there is provided a metal/circuit bonding circuit board for a power module, which is produced by any one of the above described methods for producing a metal/ceramic bonding circuit board, and there is provided a module assembled by using a metal/ceramic bonding circuit board produced by any one of the above described methods for producing a metal/ceramic bonding circuit board.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Figure 1A:
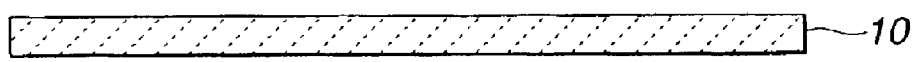
FIGS. 1A through 1C are sectional views showing producing steps of a method for producing a metal/ceramic bonding circuit board according to the present invention.

Referring now to the accompanying drawings, the preferred embodiment of a method for producing a metal/ceramic bonding circuit board according to the present invention will be described below.

In the preferred embodiment of a method for producing a metal/ceramic bonding circuit board according to the present invention, after a metal plate is bonded to at least one side of a ceramic substrate via a brazing filler metal, a resist is applied on a predetermined portion of a surface of the metal plate to etch and remove an undesired portion of the metal plate to form a metal circuit portion, to remove an undesired portion of the brazing filler metal and so forth (or to remove an undesired portion of the brazing filler metal and so forth and to etch a side portion of the metal circuit portion) while maintaining the resist, and thereafter, the resist is peeled off.

As a method for selectively removing the undesired portion of a brazing filler metal and so forth which remain after the undesired portion of the metal plate is etched, the following requirements (1) through (7) are used alone or combined with each other, or are used on appropriate conditions:

(1) the resist is not removed in a stage that the brazing filler metal is removed with chemicals, so that the control of the sectional shape is facilitated;

(2) the resist is not removed in a stage that the brazing filler metal is removed with chemicals, and in that state, the surface of the metal plate is further etched to protrude the brazing filler metal;

(3) the ratio of the etch rate of the metal plate to that of the brazing filler metal is set to be a predetermined ratio by characteristics of a brazing filler metal removing agent, so that the control of the sectional shape is facilitated;

(4) the resist is removed to prevent shear drops from being caused from the top of the metal plate;

(5) chemicals having small attacks on ceramics are used;

(6) waste solution treating facilities are simplified by selecting an appropriate brazing filler metal removing agent; and (7) the use of an alkali peeling type resist is enabled by removing the brazing filler metal in an acid state.

According to the present invention, the resist is not peeled off when chemicals for removing the brazing filler metal and so forth are used, so that the control of the protrusion of the brazing filler metal from the edge portion of the metal plate can be facilitated at low costs. In this case, the chemicals for removing the brazing filler metal and so forth preferably have the following properties.

According to the present invention, chemicals obtained from a chelating agent and aqueous hydrogen peroxide, chemicals obtained from a chelating agent, aqueous hydrogen peroxide and a pH regulator, or fluoride containing chemicals are preferably used. The chemicals for dissolving and removing the brazing filler metal and so forth may be heated to a liquid resistant temperature of the resist in order to more quickly dissolve the brazing filler metal and so forth. The treatment with chemicals may be carried out by a spraying method or a dipping process. In the case of the dipping process, a treating substrate is preferably oscillated during the liquid treatment to improve the circulating performance of the liquid to improve the uniformity of the liquid. When the brazing filler metal and so forth are dissolved with the chelating agent, the attack and damage on and to the ceramic substrate are small, so that reliability is better than a case where a mixed acid of hydrogen fluoride or the like is used. If the pH of chemicals is 6.5 or higher, the liquid resistance of the alkali peeling type resist deteriorates, and if the pH is 3 or lower, the dissolving rate of the brazing filler metal decreases, so that the pH is preferably in the range of from 4.5 to 5.8.

If the concentrations of the chelating agent and aqueous hydrogen peroxide are low, the dissolving rate and solubility of the brazing filler metal and so forth decrease, so that the brazing filler metal and so forth are easy to remain. If the concentration of the chelating agent is high, there are problems insolubility, so that the chemicals remain without being dissolved. If the concentration of the aqueous hydrogen peroxide is high, bumping of chemicals or the like is easy to occur as an abnormal reaction. Therefore, there are appropriate ranges of concentrations of the chelating agent and aqueous hydrogen peroxide. The concentration of the chelating agent is preferably in the range of 0.5 wt % to 1.5 wt %, and the concentration of aqueous hydrogen peroxide is preferably in the range of from 5% to 20%. The chelating agent is preferably EDTA which is inexpensive. If the dissolving reaction proceeds, the pH reduces. In order to make the reaction constant, the pH is preferably controlled so that the dissolving step can be stably carried out. The pH regulator is preferably a pH regulator which produces a soluble salt with the chelating agent, and is preferably aqueous ammonia or an alkali hydroxide in view of prices and flexibility. In the case of an aqueous solution having a pH of higher than 6.5, such as 4Na salt of EDTA, when the chelating agent is a salt obtained by replacing the hydrogen ion of the carboxylic acid group of the chelating agent with Na ion or the like, the pH is preferably adjusted by EDTA of the same acid radical in order to avoid the complication of the reaction system due to the presence of different chemical species.

As the brazing filler metal for bonding the metal plate to the ceramic substrate, an Ag containing brazing filler metal to which at least one element of Ti, Zr and so forth is added as an active metal may be used. A very small amount of a fourth component, such as $TiO_2$, may be added thereto in order to provide stress relaxation. In general, there is used a method for bonding a copper plate or the like having excellent electric conductivity as a metal plate to a ceramic substrate to etch the copper plate or the like in a predetermined circuit pattern.

Thereafter, when the undesired portions of the brazing filler metal and so forth are removed, if the main component of the brazing filler metal is Ag, the brazing filler metal and so forth are dissolved while the metal circuit portion is relatively dissolved and retracted, so that the brazing filler metal protrudes from the metal circuit portion. When the undesired portions of the brazing filler metal and so forth are removed, the brazing filler metal layer is easily hollowed out on the condition that only the brazing filler metal is dissolved. In this state, if a chemical polishing (etching) is carried out to etch the metal layer by tens microns, the protrusion of the brazing filler metal can be formed. On the other hand, if the ratio of the mean dissolving rate of the metal to the mean dissolving rate of the brazing filler metal is 1 or more, the protrusion of the brazing filler metal can be formed at the brazing filler metal removing step, whereas if this ratio is less than 1, the protrusion of the brazing filler metal is insufficient. If the ratio is too large, the metal is excessively dissolved while the undesired portions of the brazing filler metal and so forth are removed, so that the linearity of the circuit pattern deteriorates. Therefore, for example, the above described ratio is preferably in the range of from about 1.5 to about 5 if the thickness of the brazing filler metal is 20 $\mu$m, and is preferably in the range of from about 8 to about 13 if the thickness of the brazing filler metal is 5 $\mu$m. The mean dissolving rate is herein a value obtained by dividing the thickness of the brazing filler metal layer by the time required to dissolve and remove the undesired portions of the brazing filler metal and so forth. In order to maintain this dissolution relationship, the composition of the metal components of the brazing filler metal preferably comprises 65 to 99 wt % of Ag, 1 to 10 wt % of an active metal and the rest of substantially Cu. The brazing filler metal may be arranged on the whole surface of the ceramic substrate, or may be arranged only at a predetermined place. Thus, the brazing filler metal may be selectively used in accordance with its use if necessary. The brazing filler metal to be arranged may have any form, such as a paste form or a foil form. In order to increase the brazing filler metal protruding length for the purpose of obtaining a more reliable substrate, the side of the metal circuit portion may be etched (chemically polished) again.

In a usual etching process using copper chloride, a film of silver chloride is easily produced on the surface of the brazing filler metal layer. In addition, if the pH of a chelating agent and aqueous hydrogen peroxide is adjusted to be in the range of from 3 to 6.5, it takes a lot of time to dissolve the brazing filler metal. Therefore, the brazing filler metal layer is preferably treated with the chelating agent and aqueous hydrogen peroxide having an adjusted pH of 3 to 6.5 after the film of silver chloride on the surface of the brazing filler metal is preliminarily removed with chemicals, such as an aqueous solution of ammonium thiosulfate, as a pretreatment. The temperature of the chemicals for this pretreatment may be a room temperature. In order to stabilize operations, the chemicals may be heated to about 30° C. to be used. The concentration of the chemicals should not particularly be limited, but the concentration of the chemicals is preferably set to be about 30% in order to reduce the rate of change in concentration during operations. On this condition, the time to dip the brazing filler metal in the chemicals, such as the aqueous solution of ammonium thiosulfate, may be about one minute. If the dipping time is too long, the deterioration of the chemicals proceeds due to the contact with the metal circuit portion, so that the dipping time is preferably in the range of from one minute to three minutes. By removing the silver chloride layer in this thiosulfate treatment, the brazing filler metal removing efficiency can also be improved by other chemical treatments.

As the metal plate, a copper plate having a high thermal conductivity and electric conduction is often used. An aluminum plate, which is light and soft, may be used although its electric characteristics slightly deteriorate. In order to change characteristics of the metal, a plate of an alloy of copper and aluminum may be used.

In order to improve the weather resistant of the metal plate which is to be formed as a circuit pattern on the surface of the metal/ceramic bonding circuit board and in order to prevent its solder wettability from deteriorating with age, nickel plating, nickel alloy plating or gold plating is preferably carried out. The plating process is carried out by, e.g., a usual electroless plating method which uses chemicals containing a hypophosphite as an Ni—P electroless plating solution after degreasing, chemical polishing and pretreatment by Pd activating chemicals, or a method for carrying out electroplating while causing an electrode to contact a pattern.

With respect to the materials of the ceramic substrate used in the present invention, $Al_2O_3$ (alumina) is characterized by inexpensiveness, AlN is characterized by good thermal conductivity though it is expensive, and $Si_3N_4$ and SiC are characterized by high strength and high toughness though they have an intermediate thermal conductivity between $Al_2O_3$ and AlN and are expensive. In accordance with these characteristics of ceramic substrates, $Al_2O_3$ can provide an inexpensive ceramic circuit board, AlN can utilize its excellent radiating performance to provide a ceramic circuit board suitable for a semiconductor having a high calorific value, such as a large power chip, and $Si_3N_4$ and SiC can utilize their excellent strength to provide a ceramic circuit board which has high thermal shock resistance and high environment resistance and which is used in severe environment, such as automotive vehicles.

On the metal circuit plate of the metal/ceramic bonding circuit board produced according to the present invention, semiconductor chips, resistors and other electrical and electronic parts are mounted by soldering or the like. To the opposite side thereto, a radiating plate may be bonded by soldering or the like. Moreover, processes for bonding a plastic case and so forth, connecting external terminals to the circuit board by ultrasonic bonding wires, injecting an insulating gel, and bonding a top lid may be carried out to complete a module.

Referring to the accompanying drawing, examples of a method for producing a metal/ceramic bonding circuit board according to the present invention will be described below in detail.

EXAMPLE 1

The weight of metal powder containing metal components was measured so that the components are 91 Ag—7 Cu—1.5 Ti—0.5 $TiO_2$ (wt %). To this metal powder, about 10% of an acrylic vehicle was added. By kneading this mixture by an automatic mortar and three roll mills by a usual method, a paste-like brazing filler metal was prepared.

Figure 1B:
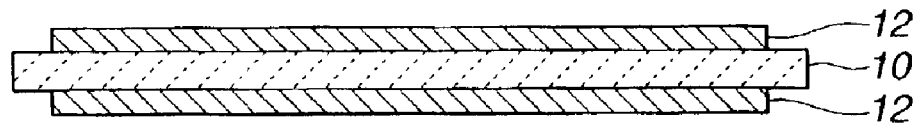
Figure 1C:
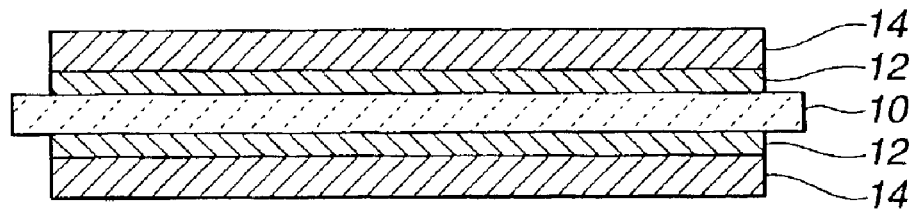

Then, as shown in FIGS. 1A through 1C, a ceramic substrate 10 was prepared (FIG. 1A), and the brazing filler metal 12 was applied on both sides of the ceramic substrate 10 by the screen printing (FIG. 1B). Then, copper plates 14 having a thickness of 0.3 mm were arranged on both sides thereof, and the copper plates 14 were bonded to the ceramic substrate 10 at 835° C. in a vacuum furnace. In order to verify the thickness of the brazing filler metal 12, the sample thus bonded was cut to measure the thickness of the brazing filler metal 12. As a result, the thickness of the brazing filler metal 12 was about 20 μm. As the ceramic substrate 10, an S grade AlN substrate produced by ATG company was used.

Figure 2A:
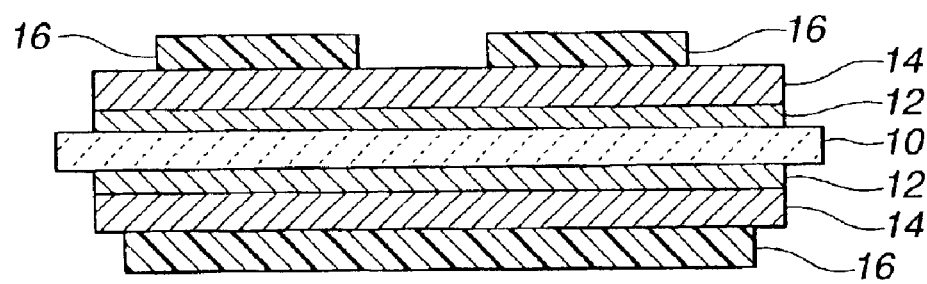
FIGS. 2A and 2B are sectional views showing producing steps of a method for producing a metal/ceramic bonding circuit board according to the present invention.
Figure 2B:
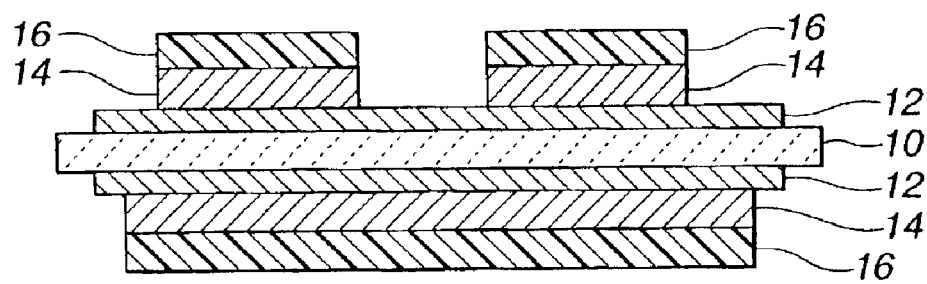

Thereafter, the sample thus bonded was taken out of the vacuum furnace. Then, as shown in FIGS. 2A through 2C, ultraviolet curing alkali peeling resists 16 (MT-UV-5203 produced by Mitsui Chemical Co., Ltd.) having a desired circuit pattern and a thickness of 10 to 15 μm were applied on both sides of the bonded copper plates 14 (FIG. 2A), and undesired portions of the copper plates 14 were removed with an etchant comprising copper chloride, aqueous hydrogen peroxide and hydrochloric acid (FIG. 2B).

Figure 3A:
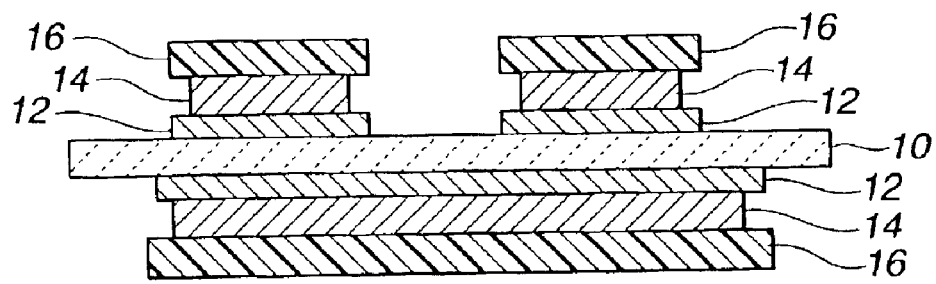
FIGS. 3A through 3C are sectional views showing producing steps of a method for producing a metal/ceramic bonding circuit board according to the present invention.
Figure 3B:
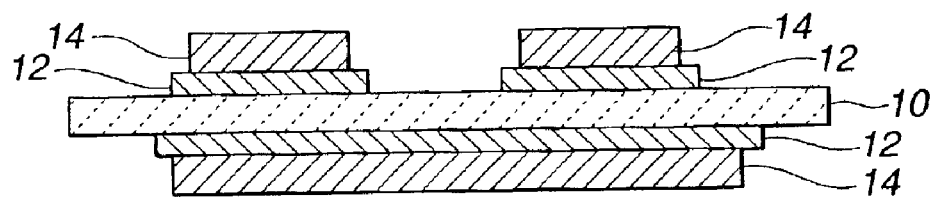
Figure 3C:
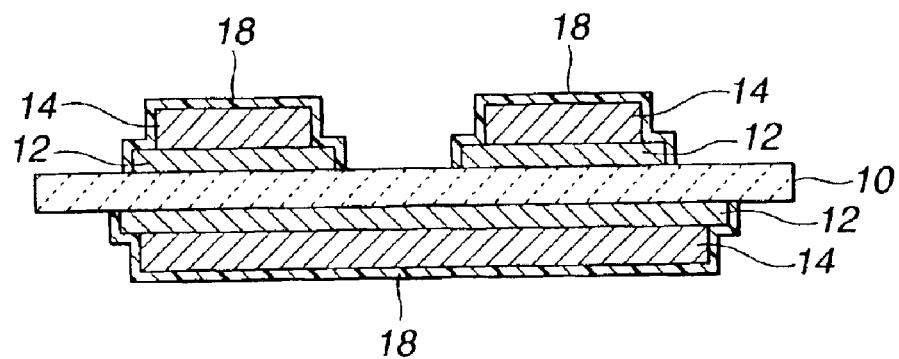

Then, in order to remove undesired portions of the brazing filler metal between circuit patterns and on the edge faces of the substrate, the sample was immersed in an aqueous solution of 30% sodium thiosulfate at a room temperature for 2 minutes, and then, the sample was dipped in a mixed solution (liquid temperature 47° C.), which was prepared by adding 14 g of EDTA and 170 ml of aqueous hydrogen peroxide (35 w/w %) to 830 g of pure water and the pH of which was adjusted to be pH 5.6 by a pH regulator (aqueous ammonia (28 w/w %)), for 150 minutes to remove undesired portions of the brazing filler metal 12 (FIG. 3A). Thereafter, the resists 16 were peeled off (FIG. 3B), and an Ni—P electroless plating 18 was carried out (FIG. 3C). As an Ni—P plating solution, Nimuden SX (produced by C. Uyemura & Co., Ltd.) was used. At this time, the ratio of the mean dissolving rate of copper to the mean dissolving rate of the brazing filler metal was 1.8.

Figure 4:
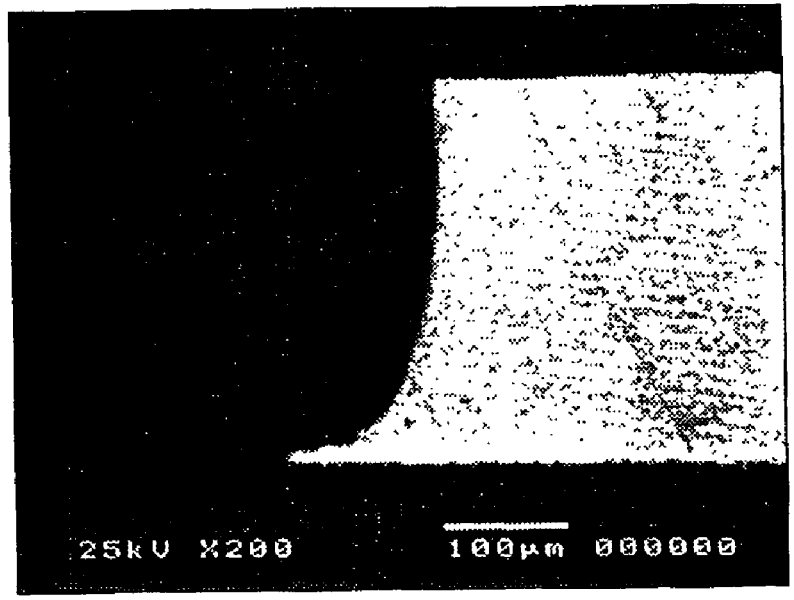
FIG. 4 is a photomicrograph showing a cross section of a metal/ceramic bonding circuit board obtained in Example 1.

The brazing filler metal protruding length of the metal/ceramic bonding circuit board obtained in this example was 50 μm, and the brazing filler metal removing performance and circuit pattern performance thereof were good. The photomicrograph of a cross section of the metal/ceramic bonding circuit board thus obtained is shown in FIG. 4.

EXAMPLE 2

The substrate treated with the mixed solution of EDTA, aqueous hydrogen peroxide and pH regulator in Example 1 was treated with an etchant comprising copper chloride, hydrochloric acid and hydrogen peroxide again. Then, the resists were peeled off, and the Ni—P electroless plating was carried out. The brazing filler metal protruding length of the metal/ceramic bonding circuit board obtained in this example was 120 μm, and the brazing filler metal removing performance and circuit pattern performance thereof were good.

EXAMPLE 3

The same treatment as that in Example 2 was carried out, except that $Al_2O_3$ was used as the ceramic. The brazing filler metal protruding length of the metal/ceramic bonding circuit board obtained in this example was 120 μm, and the brazing filler metal removing performance and circuit pattern performance thereof were good.

COMPARATIVE EXAMPLE 1

The same treatment as that in Example 2 was carried out, except that the pH of the mixed solution of EDTA, aqueous hydrogen peroxide and pH regulator was adjusted to be 7.0, the temperature of the mixed solution was 23° C. and the dipping time was 120 minutes. However, since etching resists used in this comparative example were alkali peeling type resists similar to Examples 1 through 3, the undesired portions of the brazing filler metal were removed without being capable of maintaining the resists. As a result, the brazing filler metal protruding length of the metal/ceramic bonding circuit board obtained in this comparative example was 120 μm, and the brazing filler metal removing performance thereof was good, but the circuit pattern performance thereof was not good.

COMPARATIVE EXAMPLE 2

The same treatment as that in Example 1 was carried out, except that a mixed solution was prepared by adding 14 g of EDTA, 170 ml of aqueous hydrogen peroxide (35 w/w %) and 110 ml of aqueous ammonia (28 w/w %) to 730 g of pure water and adjusting the pH of the mixed solution to be 10 or higher, the temperature of the mixed solution was 23° C. and the dipping time was 40 minutes. In this comparative example, the resists were not maintained due to alkali when the brazing filler metal was removed. The brazing filler metal removing performance of the metal/ceramic bonding circuit board obtained in this comparative example was good. However, the circuit pattern performance thereof was not good, and the brazing filler metal protruding length thereof was −100 μm. In this case, the ratio of the mean dissolving rate of copper to the mean dissolving rate of the brazing filler metal was 0.1 or less.

The results in Examples 1 through 3 and Comparative Examples 1 and 2 are shown in the following Tables 1 and 2.

TABLE 1

|  | Ceramic | EDTA (g) | H₂O₂ (ml) | H₂O (g) | pH (※1) | Temp. (° C.) | Time (min.) |
|---|---|---|---|---|---|---|---|
| Ex.1 | AlN | 14 | 170 | 830 | 5.6 | 47 | 150 |
| Ex.2 | AlN | 14 | 170 | 830 | 5.6 | 47 | 150 |
| Ex.3 | Al₂O₃ | 14 | 170 | 830 | 5.6 | 47 | 150 |
| Comp.Ex.1 | AlN | 14 | 170 | 830 | 7 | 23 | 120 |
| Comp.Ex.2 | AlN | 14 | 170 | 730 | >10 (※2) | 23 | 40 |

※1: aqueous ammonia is added so that pH is a predetermined value.
※2: aqueous ammonia 110 ml

TABLE 2

|  | Brazing Filler Metal Removing Performance | Brazing Filler Metal Protruding Length (μm) | Circuit Pattern Performance |
|---|---|---|---|
| Ex.1 | good | 50 | good |
| Ex.2 | good | 120 | good |
| Ex.3 | good | 120 | good |
| Comp.Ex.1 | good | 100 | no good |
| Comp.Ex.2 | good | −100 | no good |

As described above, according to the present invention, it is possible to easily control the sectional shape of a metal/ceramic bonding circuit board by a smaller number of steps and at low costs, and it is possible to produce a metal/ceramic bonding circuit board which is more reliable with respect to thermal shock resistance and insulation performance. In addition, according to the present invention, it is possible to prevent shear drops from being caused from the top of a metal plate, and it is possible to use chemicals which have smaller attacks on a ceramic substrate and which considers environment. Moreover, it is possible to simplify facilities, such as waste solution treating facilities, and waste solution treatments.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for producing a metal/ceramic bonding circuit board comprising the steps of:
    bonding a metal plate of a metal to at least one side of a ceramic substrate via a brazing filler metal;
    applying a resist on a predetermined portion of a surface of said metal plate to etch and remove an undesired portion of said metal plate to form a metal circuit portion; and
    removing an undesired portion of said brazing filler metal and a reaction product, which is produced by a reaction of said brazing filler metal with said ceramic substrate, while maintaining said resist, and thereafter, peeling off said resist to form a circuit pattern,
    wherein a ratio of a mean dissolving rate of said metal to a mean dissolving rate of said brazing filler metal is in the range of from 1 to 20 at said removing step.

2. A method for producing a metal/ceramic bonding circuit board comprising the steps of:
    bonding a metal plate of a metal to at least one side of a ceramic substrate via a brazing filler metal;
    applying a resist on a predetermined portion of a surface of said metal plate to etch and remove an undesired portion of said metal plate to form a metal circuit portion; and
    removing an undesired portion of said brazing filler metal and a reaction product, which is produced by a reaction of said brazing filler metal with said ceramic substrate, and etching a side portion of said metal circuit portion, while maintaining said resist, and thereafter, peeling off said resist to form a circuit pattern,
    wherein a ratio of a mean dissolving rate of said metal to a mean dissolving rate of said brazing filler metal is in the range of from 1 to 20 at said removing step.

3. A method for producing a metal/ceramic bonding circuit board comprising the steps of:
    bonding a metal plate of a metal to at least one side of a ceramic substrate via a brazing filler metal; and
    removing an undesired portion of said brazing filler metal and a reaction product, which is produced by a reaction of said brazing filler metal with said ceramic substrate, to form a circuit pattern,
    wherein at said removing step, there are used such chemicals that a ratio of a mean dissolving rate of said metal to a mean dissolving rate of said brazing filler metal is in the range of from 1 to 20.

4. A method for producing a metal/ceramic bonding circuit board as set forth in any one of claims 1, 2 and 3, wherein said resist is an alkali peeling type resist.

5. A method for producing a metal/ceramic bonding circuit board as set forth in any one of claims 1, 2 and 3, wherein a brazing filler metal removing agent having a pH of 3 to 6.5 is used at said removing step.

6. A method for producing a metal/ceramic bonding circuit board as set forth in any one of claims 1, 2 and 3, wherein a brazing filler metal removing agent, which is prepared from a chelating agent and aqueous hydrogen peroxide, or a brazing filler metal removing agent, which is prepared from a chelating agent, aqueous hydrogen peroxide and a pH regulator, is used at said removing step.

7. A method for producing a metal/ceramic bonding circuit board as set forth in claim 6, wherein said chelating agent is formed of one or more compounds selected from the group consisting of ethylenediaminetetraacetic acid, nitrilotriacetic acid, cyclohexanediamine-N,N'-tetraacetic acid, diethylefletriamifle pentaacetic acid, triethylenetetramine-N,N,N',N'',N''',N'''-hexaacetic acid, glycoletherdiamifle-N,N,N',N'-tetraacetic acid and salts thereof.

8. A method for producing a metal/ceramic bonding circuit board as set forth in any one of claims 1, 2, and 3, wherein said ceramic substrate is formed of a material selected from the group consisting of nitrides, oxides and carbides.

9. A method for producing a metal/ceramic bonding circuit board as set forth in any one of claims 1, 2 and 3, wherein said brazing filler metal is formed of a material selected from the group consisting of alloys containing silver and an active metal, compounds containing silver and an active metal, and mixtures thereof.

10. A method for producing a metal/ceramic bonding circuit board as set forth in any one of claims 1, 2, and 3, wherein said metal plate is formed of a material selected from the group consisting of copper, aluminum, alloys containing copper, alloys containing aluminum, and mixtures thereof.

11. A method for producing a metal/ceramic bonding circuit board as set forth in any one of claims 1, 2 and 3, wherein a silver chloride layer on the surface of said brazing filler metal is treated with chemicals to be removed, before removing said undesired portion of said brazing filler metal and said reaction product of said brazing filler metal with said ceramic substrate after etching said undesired portion of said metal plate.

12. A method for producing a metal/ceramic bonding circuit board as set forth in claim 11, wherein said chemicals used for removing said silver chloride layer is at least one of ammonium thiosulfate and an alkali thiosulfate.

13. A method for producing a metal/ceramic bonding circuit board as set forth in any one of claims 1, 2 and 3, wherein a brazing filler metal protruding length, which is a length of said brazing filler metal protruding from an edge portion of said metal circuit portion, is 30 µm or more.

14. A method for producing a metal/ceramic bonding circuit board as set forth in any one of claims 1, 2 and 3, wherein said metal circuit portion and said brazing filler metal are treated by at least one of nickel plating, nickel alloy plating, gold plating and preservation, after peeling of said resist.

15. A method for producing a metal/ceramic bonding circuit board comprising the steps of:
bonding a metal plate of a metal to at least one side of a ceramic substrate via a brazing filler metal;
applying a resist on a predetermined portion of a surface of said metal plate to etch and remove an undesired portion of said metal plate to form a metal circuit portion; and
removing an undesired portion of said brazing filler metal and a reaction product, which is produced by a reaction of said brazing filler metal with said ceramic substrate, while maintaining said resist, and thereafter, peeling off said resist to form a circuit pattern,
wherein a brazing filler metal removing agent, which is prepared from a chelating agent and aqueous hydrogen peroxide, or a brazing filler metal removing agent, which is prepared from a chelating agent, aqueous hydrogen peroxide and a pH regulator, is used at said removing step.

16. A method for producing a metal/ceramic bonding circuit board as set forth in claim 15, wherein said chelating agent is formed of one or more compounds selected from the group consisting of ethylenediaminetetraacetic acid, nitrilotriacetic acid, cyclohexanediamine-N,N'-tetraacetic acid, diethylenetriamine-pentaacetic acid, triethylenetetramifle-N,N,N',N",N''',N''''-hexaacetic acid, glycoletherdiamine-N,N,N',N'-tetraacetic acid and salts thereof.

17. A method for producing a metal/ceramic bonding circuit board comprising the steps of:
bonding a metal plate of a metal to at least one side of a ceramic substrate via a brazing filler metal;
applying a resist on a predetermined portion of a surface of said metal plate to etch and remove an undesired portion of said metal plate to form a metal circuit portion; and
removing an undesired portion of said brazing filler metal and a reaction product, which is produced by a reaction of said brazing filler metal with said ceramic substrate, while maintaining said resist, and thereafter, peeling off said resist to form a circuit pattern,
wherein a silver chloride layer on the surface of said brazing filler metal is treated with chemicals to be removed, before removing said undesired portion of said brazing filler metal and said reaction product of said brazing filler metal with said ceramic substrate after etching said undesired portion of said metal plate, and
wherein said chemicals used for removing said silver chloride layer is at least one of ammonium thiosulfate and an alkali thiosulfate.

18. A method for producing a metal/ceramic bonding circuit board comprising the steps of:
bonding a metal plate of a metal to at least one side of a ceramic substrate via a brazing filler metal;
applying a resist on a predetermined portion of a surface of said metal plate to etch and remove an undesired portion of said metal plate to form a metal circuit portion; and
removing an undesired portion of said brazing filler metal and a reaction product, which is produced by a reaction of said brazing filler metal with said ceramic substrate, while maintaining said resist, and thereafter, peeling off said resist to form a circuit pattern,
wherein a brazing filler metal protruding length, which is a length of said brazing filler metal protruding from an edge portion of said metal circuit portion, is 30µm or more.

19. A method for producing a metal/ceramic bonding circuit board comprising the steps of:
bonding a metal plate of a metal to at least one side of a ceramic substrate via a brazing filler metal;
applying a resist on a predetermined portion of a surface of said metal plate to etch and remove an undesired portion of said metal plate to form a metal circuit portion; and
removing an undesired portion of said brazing filler metal and a reaction product, which is produced by a reaction of said brazing filler metal with said ceramic substrate, and etching a side portion of said metal circuit portion, while maintaining said resist, and thereafter, peeling off said resist to form a circuit pattern,
wherein a brazing filler metal removing agent, which is prepared from a chelating agent and aqueous hydrogen peroxide, or a brazing filler metal removing agent, which is prepared from a chelating agent, aqueous hydrogen peroxide and a pH regulator, is used at said removing step.

20. A method for producing a metal/ceramic bonding circuit board, as set forth in claim 19, wherein said chelating agent is formed of one or more compounds selected from the group consisting of ethylenediaminetetraacetic acid, nitrilotriacetic acid, cyclohexanediamine-N,N'-tetraacetic acid, diethylenetriamifle pentaacetic acid, triethylenetetramifle-N,N,N',N",M''',N''''-hexaacetic acid, glycoletherdiamine-N,N,N',N'-tetraacetic acid and salts thereof.

21. A method for producing a metal/ceramic bonding circuit board comprising the steps of:
bonding a metal plate of a metal to at least one side of a ceramic substrate via a brazing filler metal;
applying a resist on a predetermined portion of a surface of said metal plate to etch and remove an undesired portion of said metal plate to form a metal circuit portion; and
removing an undesired portion of said brazing filler metal and a reaction product, which is produced by a reaction of said brazing filler metal with said ceramic substrate, and etching a side portion of said metal circuit portion, while maintaining said resist, and thereafter, peeling off said resist to form a circuit pattern, wherein a silver chloride layer on the surface of said brazing filler metal is treated with chemicals to be removed, before removing said undesired portion of said brazing filler metal and said reaction product of said brazing filler metal with said ceramic substrate after etching said undesired portion of said metal plate, and wherein said chemicals used for removing said silver chloride layer is at least one of ammonium thiosulfate and an alkali thiosulfate.

22. A method for producing a metal/ceramic bonding circuit board comprising the steps of:

bonding a metal plate of a metal to at least one side of a ceramic substrate via a brazing filler metal;

applying a resist on a predetermined portion of a surface of said metal plate to etch and remove an undesired portion of said metal plate to form a metal circuit portion; and removing an undesired portion of said brazing filler metal and a reaction product, which is produced by a reaction of said brazing filler metal with said ceramic substrate, and etching a side portion of said metal circuit portion, while maintaining said resist, and thereafter, peeling off said resist to form a circuit pattern, wherein a brazing filler metal protruding length, which is a length of said brazing filler metal protruding from an edge portion of said metal circuit portion, is 30μm or more.

23. A method for producing a metal/ceramic bonding circuit board as set forth in claim 18, wherein said resist is an alkali peeling type resist.

24. A method for producing a metal/ceramic bonding circuit board as set forth in claim 18, wherein a brazing filler metal removing agent having a pH of 3 to 6.5 is used at said removing step.

25. A method for producing a metal/ceramic bonding circuit board as set forth in claim 18, wherein said ceramic substrate is formed of a material selected from the group consisting of nitrides, oxides and carbides.

26. A method for producing a metal/ceramic bonding circuit board as set forth in claim 18, wherein said brazing filler metal is formed of a material selected from the group consisting of alloys containing silver and an active metal, compounds containing silver and an active metal, and mixtures thereof.

27. A method for producing a metal/ceramic bonding circuit board as set forth in claim 18, wherein said metal plate is formed of a material selected from the group consisting of copper, aluminum, alloys containing copper, alloys containing aluminum, and mixtures thereof.

28. A method for producing a metal/ceramic bonding circuit board comprising the steps of:

bonding a metal plate of a metal to at least one side of a ceramic substrate via a brazing filler metal;

applying a resist on a predetermined portion of a surface of said metal plate to etch and remove an undesired portion of said metal plate with an etchant to form a metal circuit portion;

removing an undesired portion of said brazing filler metal and a reaction product, which is produced by a reaction of said brazing filler metal with said ceramic substrate, with chemicals while maintaining said resist remains; and thereafter, peeling off said resist to form a circuit pattern, wherein a silver chloride layer on the surface of said brazing filler metal is treated with chemicals to be removed, before removing said undesired portion of said brazing filler metal and said reaction product of said brazing filler metal with said ceramic substrate after etching said undesired portion of said metal plate.

29. A method for producing a metal/ceramic bonding circuit board as set forth in claim 18, wherein said metal circuit portion and said brazing filler metal are treated by at least one of nickel plating, nickel alloy plating, gold plating and preservation, after peeling of said resist.

30. A method for producing a metal/ceramic bonding circuit board as set forth in claim 22, wherein said resist is an alkali peeling type resist.

31. A method for producing a metal/ceramic bonding circuit board as set forth in claim 22, wherein a brazing filler metal removing agent having a pH of 3 to 6.5 is used at said removing step.

32. A method for producing a metal/ceramic bonding circuit board as set forth in claim 22, wherein said ceramic substrate is formed of a material selected from the group consisting of nitrides, oxides and carbides.

33. A method for producing a metal/ceramic bonding circuit board as set forth in claim 22, wherein said brazing filler metal is formed of a material selected from the group consisting of alloys containing silver and an active metal, compounds containing silver and an active metal, and mixtures thereof.

34. A method for producing a metal/ceramic bonding circuit board as set forth in claim 22, wherein said metal plate is formed of a material selected from the group consisting of copper, aluminum, alloys containing copper, alloys containing aluminum, and mixtures thereof.

35. A method for producing a metal/ceramic bonding circuit board comprising the steps of:

bonding a metal plate of a metal to at least one side of a ceramic substrate via a brazing filler metal;

applying a resist on a predetermined portion of a surface of said metal plate to etch and remove an undesired portion of said metal plate with a first etchant to form a metal circuit portion; and removing an undesired portion of said brazing filler metal and a reaction product, which is produced by a reaction of said brazing filler metal with said ceramic substrate, with chemicals while maintaining said resist remains;

etching a side portion of said metal circuit portion with a second etchant while maintaining said resist remains; and thereafter, peeling off said resist to form a circuit pattern, wherein a silver chloride layer on the surface of said brazing filler metal is treated with chemicals to be removed, before removing said undesired portion of said brazing filler metal and said reaction product of said brazing filler metal with said ceramic substrate after etching said undesired portion of said metal plate.

36. A method for producing a metal/ceramic bonding circuit board as set forth in claim 22, wherein said metal circuit portion and said brazing filler metal are treated by at least one of nickel plating, nickel alloy plating, gold plating and preservation, after peeling of said resist.

* * * * *

UNITED STATES PATENT AND TRADEMARK OFFICE
CERTIFICATE OF CORRECTION

PATENT NO. : 6,918,529 B2
APPLICATION NO. : 10/254750
DATED : July 19, 2005
INVENTOR(S) : Tsukaguchi et al.

It is certified that error appears in the above-identified patent and that said Letters Patent is hereby corrected as shown below:

On the Cover Page, in the Inventor Section (75) please add the following inventors:

--Masahiro Furo--; and
--Yoshinori Yamanaka--.

Claim 7, column 12 line 52, the word "diethylefletriamifle pentaacetic" should be corrected to --diethylenetriamine-pentaacetic--.

Claim 7, column 12 line 52, the word "glycoletherdiamifle" should be corrected to --glycoletherdiamine--.

Claim 16, column 13 line 52, the word "triethylenetetramifle" should be corrected to --triethylenetetramine--.

Claim 20, column 14 line 25, "diethylenetriamifle" should be corrected to --diethylenetriamine--.

Claim 20, column 14 line 25, the word "triethylenetetramifle" should be corrected to --triethylenetetramine--.

Claim 20, column 14 line 26, "M'''" should be corrected to --N'''--.

Signed and Sealed this

Fifth Day of December, 2006

JON W. DUDAS
*Director of the United States Patent and Trademark Office*